(12) United States Patent
McManus et al.

(10) Patent No.: US 6,538,250 B2
(45) Date of Patent: Mar. 25, 2003

(54) MICROBOLOMETER FOCAL PLANE ARRAY WITH CONTROLLED BIAS

(75) Inventors: Timothy J. McManus, Minneapolis, MN (US); Shane M. Anderson, Brooklyn Park, MN (US)

(73) Assignee: Infrared Solutions, Inc., Minneapolis, MN (US)

( * ) Notice: Subject to any disclaimer, the term of this patent is extended or adjusted under 35 U.S.C. 154(b) by 0 days.

(21) Appl. No.: 10/198,295

(22) Filed: Jul. 5, 2002

(65) Prior Publication Data

US 2002/0185601 A1 Dec. 12, 2002

Related U.S. Application Data

(63) Continuation of application No. 09/414,688, filed on Oct. 7, 1999, now Pat. No. 6,444,983.

(51) Int. Cl.[7] .............................................. H01L 25/00
(52) U.S. Cl. ................. 250/332; 250/338.1; 250/338.4; 250/252.1
(58) Field of Search ........................... 250/332, 338.1, 250/338.4, 370.08, 252.1

(56) References Cited

U.S. PATENT DOCUMENTS

| | | | | |
|---|---|---|---|---|
| 5,021,663 A | * | 6/1991 | Hornbeck | 250/349 |
| 5,650,622 A | * | 7/1997 | Ookawa et al. | 250/332 |
| 5,729,019 A | * | 3/1998 | Krafthefer | 250/353 |
| 5,811,808 A | * | 9/1998 | Cannata et al. | 250/332 |
| 5,831,266 A | * | 11/1998 | Jerominek | 250/338.4 |
| 6,023,061 A | * | 2/2000 | Bodkin | 250/332 |
| 6,028,309 A | * | 2/2000 | Parrish et al. | 250/332 |
| 6,444,983 B1 | * | 9/2002 | McManus et al. | 250/332 |

* cited by examiner

*Primary Examiner*—Huy Mai
(74) *Attorney, Agent, or Firm*—Robert A. Pajak

(57) ABSTRACT

A method and apparatus for controlling bias for an microbolometer focal plane array which includes use of one thermally-shorted microbolometer detector thermally shorted to the substrate upon which one or more thermally-isolated microbolometers are constructed. A calibration bias source magnitude is determined and continually adjusted as a function of (i) the temperature related reading value of the resistance of the thermally-shorted microbolometer at calibration, and (ii) the temperature related reading value of the resistance of the thermally-shorted microbolometer after each image sample is taken.

13 Claims, 5 Drawing Sheets

INCIDENT
INFARED RADIATION

MICROBOLOMETER FOCAL PLANE ARRAY WITH CONTROLLED BIAS

This application is a continuation of application Ser. No. 09/414,688 filed on Oct. 07, 1999 now U.S. Pat. No. 6,444,983.

FIELD OF THE INVENTION

The present invention relates generally to imaging systems employing a microbolometer focal plane array. More specifically, the present invention is directed to a method and circuitry for correcting temperature-induced errors by way of a controlled bias.

BACKGROUND OF THE INVENTION

An infrared detector called the "bolometer," now well known in the art, operates on the principle that the electrical resistance of the bolometer material changes with respect to the bolometer temperature, which in turn changes in response to the quantity of absorbed incident infrared radiation. These characteristics can be exploited to measure incident infrared radiation on the bolometer by sensing the resulting change in its resistance. When used as an infrared detector, the bolometer is generally thermally isolated from its supporting substrate or surroundings to allow the absorbed incident infrared radiation to generate a temperature change in the bolometer material.

Modern microbolometer structures were developed by the Honeywell Corporation. For a recent summary of references see U.S. Pat. No. 5,420,419. A two-dimensional array of closely spaced microbolometer detectors is typically fabricated on a monolithic silicon substrate or integrated circuit. Commonly, each of these microbolometer detectors are fabricated on the substrate by way of an, commonly referred to, air bridge structure which includes a temperature sensitive resistive material element that is substantially thermally isolated from the substrate. This aforesaid microbolometer detector structure is herein referred to as a "thermally-isolated microbolometer." The resistive element, for example may be vanadium oxide that absorbs infrared radiation. The constructed air bridge structure provides good thermal isolation between the resistive element of each microbolometer detector and the silicon substrate. An exemplary microbolometer structure may dimensionally be in the order of approximately 50 microns by 50 microns.

In contrast, a microbolometer detector that is fabricated directly on the substrate, without the air-bridge structure, is herein referred to as a "thermally shorted microbolometer," since it will be directly affected by the temperature of the substrate and/or package. Alternately, it may be regarded as a "heat sunk" pixel since it is shorted to the substrate.

Microbolometer detector arrays may be used to sense a focal plane of incident radiation (typically infrared). Each microbolometer detector of an array may absorb any radiation incident thereon, resulting in a corresponding change in its temperature, which results in a corresponding change in its resistance. With each microbolometer functioning as a pixel, a two-dimensional image or picture representation of the incident infrared radiation may be generated by translating the changes in resistance of each microbolometer into a time-multiplexed electrical signal that can be displayed on a monitor or stored in a computer. The circuitry used to perform this translation is commonly known as the Read Out Integrated Circuit (ROIC), and is commonly fabricated as an integrated circuit on a silicon substrate. The microbolometer array may then be fabricated on top of the ROIC. The combination of the ROIC and microbolometer array is commonly known as a microbolometer infrared Focal Plane Array (FPA). Microbolometer FPAs containing as many as 640×480 detectors have been demonstrated.

Individual microbolometers will have non-uniform responses to uniform incident infrared radiation, even when the bolometers are manufactured as part of a microbolometer FPA. This is due to small variations in the detectors' electrical and thermal properties as a result of the manufacturing process. These non-uniformities in the microbolometer response characteristics must be corrected to produce an electrical signal with adequate signal-to-noise ratio for image processing and display.

Under the conditions where a uniform electric signal bias source and incident infrared radiation are applied to an array of microbolometer detectors, differences in detector response will occur. This is commonly referred to as spatial non-uniformity, and is due to the variations in a number of critical performance characteristics of the microbolometer detectors. This is a natural result of the microbolometer fabrication process. The characteristics contributing to spatial non-uniformity include the infrared radiation absorption coefficient, resistance, temperature coefficient of resistance (TCR), heat capacity, and thermal conductivity of the individual detectors.

The magnitude of the response non-uniformity can be substantially larger than the magnitude of the actual response due to the incident infrared radiation. The resulting ROIC output signal is difficult to process, as it requires system interface electronics having a very high dynamic range. In order to achieve an output signal dominated by the level of incident infrared radiation, processing to correct for detector non-uniformity is required.

Previous methods for implementing an ROIC for microbolometer arrays have used an architecture wherein the resistance of each microbolometer is sensed by applying a uniform electric signal source, e.g., voltage or current sources, and a resistive load to the microbolometer element. The current resulting from the applied voltage is integrated over time by an amplifier to produce an output voltage level proportional to the value of the integrated current. The output voltage is then multiplexed to the signal acquisition system.

Gain and offset corrections are applied to the output signal to correct for the errors that may arise from the microbolometer property non-uniformities. This process is commonly referred to as two-point correction. In this technique two correction coefficients are applied to the sampled signal of each element. The gain correction is implemented by multiplying the output voltage by a unique gain coefficient. The offset correction is implemented by adding a unique offset coefficient to the output voltage. Both analog and digital techniques have been utilized to perform this two-point non-uniformity correction.

The current state-of-the-art in microbolometer array ROICs suffers from two principal problems. The first problem is that the large magnitude of the microbolometer introduced non-uniformities in the ROIC output signal requires a large instantaneous dynamic range in the sensor interface electronics, increasing the cost and complexity for the system. Current advanced ROIC architectures incorporate part of the correction on the ROIC to minimize the instantaneous dynamic range requirements at the acquisition systems interface.

The second problem is that the application of a fixed coefficient two-point gain and offset correction method to minimize array non-uniformity works well only for a very small range of substrate temperatures, on the order of 0.005 to 0.025 degrees Kelvin. In order to maintain the substrate temperature within this range, a thermoelectric cooler, temperature sensor, and temperature control electronics are required, again adding to system cost and complexity.

Application of the thermoelectric cooler directly reduces the need for a large instantaneous dynamic range in the sensor interface electronics. This is so, since infrared induced temperatures changes in the microbolometer detector are very small as compared to induced temperature change in the microbolometer detector due to changes in substrate temperature from heat produced by the accompanying electronics as well as the operating environment temperature.

An uncooled microbolometer focal plane array is taught in U.S. Pat. No. 5,756,999, entitled, "Methods and Circuitry for Correcting Temperature-induced Errors in Microbolometer Focal Plane Array, issued to Parrish, et. al. Therein a bias correction method and a pre-bias correction method are taught. With regard to the bias correction method, as stated therein, "According to the bias-correction method, a unique bias amplitude is applied to each detector during the integration period to support uniformity correction. The bias-correction method can be implemented as an adjustable voltage, current, or load bias that is applied to the microbolometer detectors during the integration (measurement) period . . . the bias-correction value is applied during the integration period of the microbolometer detector using an adjustable voltage source . . . The bias-correction value is controlled by the output of a digital-to-analog converter (DAC) . . . The adjustable bolometer bias may be used to correct the optical gain of the signal for uniform output at a particular substrate temperature in conjunction with single point offset correction . . . to remove residual fixed offsets."

Although the aforesaid patent sets forth improved methods for correcting temperature induced errors in microbolometer focal plane arrays, these methods still remain complex and time consuming.

SUMMARY OF THE INVENTION

An object of the present invention is to provide a simple method for correcting for temperature induced errors in microbolometer focal plane arrays.

Another object of the invention is to provide a simple bias correction scheme to minimize the need for a large dynamic range in the sensor interface electronics.

In accordance with the present invention, a single thermally-shorted microbolometer detector is employed for controlling the magnitude of an electric signal bias source that is applied to all microbolometers of a focal plane array on a substrate. A calibration bias source magnitude is determined and continually adjusted as a function of the reading value of the resistance of the thermally-shorted microbolometer at calibration, and readings of the thermally-shorted microbolometer after each image sample is taken.

DETAILED DESCRIPTION OF THE INVENTION

Constructions of microbolometer focal plane arrays and application circuitry are taught in the aforesaid patents and is incorporated herein by reference. Individual microbolometer detectors including both thermally-isolated and thermally-shorted varieties, and associated detector circuitry are also described in detail therein. However, the following excerpt is provided as a foundation for the description of the present invention that follows.

Figure 1A:
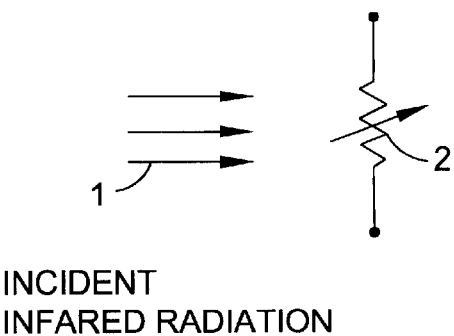
FIGS. 1A–1C are schematic diagrams of prior art bolometer circuits.
Figure 1B:
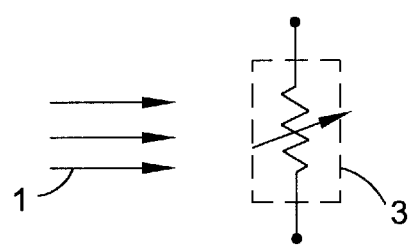
Figure 1C:
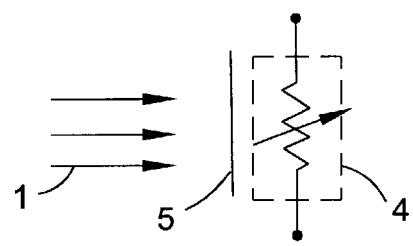

FIGS. 1A, 1B and 1C illustrate three possible configurations for microbolometer detectors. Incident infrared radiation 1 is projected onto each of the microbolometer detectors. The microbolometer detector 2, shown in FIG. 1A, is thermally shorted to the substrate material, herein referred to as the thermally-shorted microbolometer. This is a common form of bolometer and is representative of most single-detector bolometers and thermistors. Microbolometers can be manufactured to provide a high thermal conductivity to the substrate, or this property can be introduced through post-processing whereby a thermally conductive material is selectively applied to these microbolometer detectors. Although this detector is thermally connected to the substrate, the resistance properties and temperature coefficient of resistance (TCR) of these detectors are similar to the thermally-isolated-microbolometer detector 3, shown in FIG. 1B. These detectors have a high TCR (1% to 5%/degree C.) which is designated by the arrow in the resistor symbol.

The thermally-isolated-microbolometer 3 is most commonly used to sense infrared radiation. Thermally-isolated-microbolometer 3 is thermally isolated from its supporting substrate or surroundings to allow the absorbed incident infrared radiation to generate a temperature change in the microbolometer material. In FIG. 1B, the dashed square box around the detector designates this isolation.

The final configuration, shown in FIG. 1C, is the shielded microbolometer 4. The shielded microbolometer 4 is identical to the thermally-isolated-microbolometer 3 with the exception that incident infrared radiation 1 is shielded from the microbolometer. The radiation shield is designated by a solid line 5 in FIG. 1C.

The principles of operation for the microbolometers shown in FIGS. 1A–1C are as follows. The temperature of the non-isolated microbolometer 2 is dominated by the high thermal conductivity to the substrate. Therefore incident infrared radiation and electrical power dissipated in the microbolometer have little effect on the temperature of the microbolometer. Microbolometer 2 has the same high TCR as the thermally isolated microbolometer 3 and therefore provides a high sensitivity reference to the substrate temperature.

The thermally isolated microbolometer 3 changes temperature in response to the incident radiation level changes in the substrate temperature, and the electrical power dissipated in the detector during the measurement of the microbolometer resistance. The heating due to resistive measurement is referred to as self-heating. As fabricated, the thermally isolated microbolometer is not perfectly insulated from the substrate. Therefore the temperature of the thermally isolated microbolometer does track the substrate temperature to some extent, although the rate of temperature change due to this mechanism is much slower than those due to incident radiation or self-heating.

The shielded isolated microbolometer 4 does not change temperature in response to the incident radiation level, but does change temperature as a result of self heating and temperature changes in the substrate.

In the present invention, the thermally-isolated microbolometer 2 depicted in FIG. 1 may be thought of as a heat sunk pixel. This heat sunk pixel may be constructed by way of thermally shorting a thermally-isolated microbolometer by way of a thermally conductive paste, or other techniques. However, it is of paramount importance in accordance with the present invention that it be primarily responsive to the temperature of the substrate upon which the thermally-isolated microbolometers are constructed.

Figure 2:
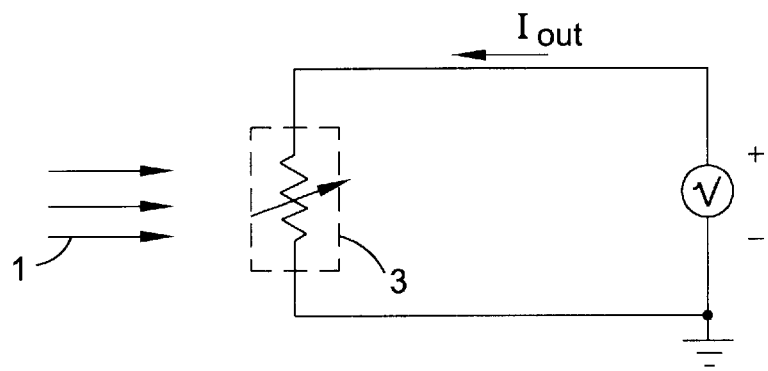
FIG. 2 is a schematic diagram illustrating an applied voltage bias method for measuring microbolometer resistance.
Figure 4:
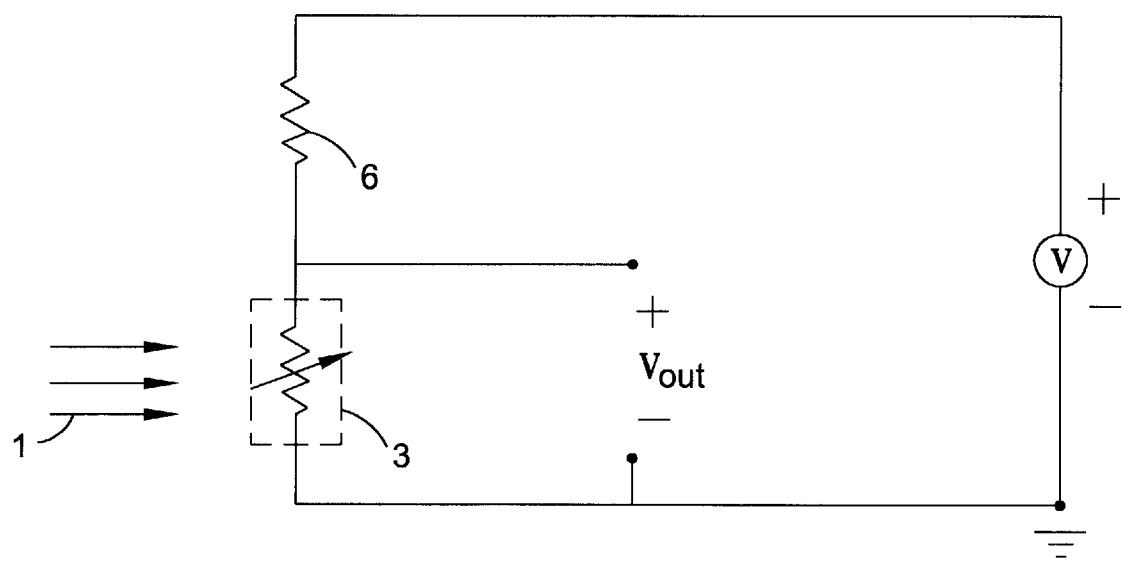
FIG. 4 is a schematic diagram illustrating an applied voltage bias method for measuring microbolometer resistance.
Figure 3:
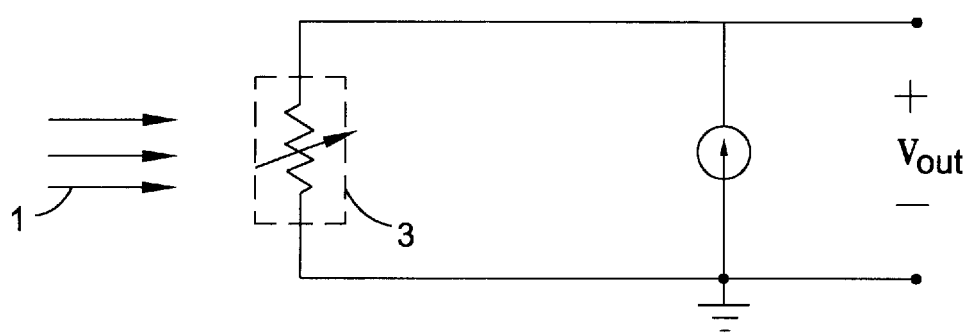
FIG. 3 is a schematic diagram illustrating an applied current bias method for measuring microbolometer resistance.

FIGS. 2–4 illustrate three commonly used techniques for measuring the resistance of a microbolometer detector. FIG. 2 shows an applied electric bias voltage method of sensing the detector resistance. An applied voltage bias is used to generate a current in the circuit designated $I_{out}$. By measuring the current $I_{out}$, the resistance of the microbolometer detector can be determined. The relationship between the applied voltage and measured current is defined by Ohms Law.

$$I_{out} = V_{applied}/R_{bolometer} \quad (1)$$

Where $I_{out}$ is the measured current, $V_{applied}$ is the applied voltage bias, and $R_{bolometer}$ is the microbolometer detector resistance.

A second method for measuring the microbolometer resistance is shown in FIG. 3. Here a constant electric current bias is applied to the microbolometer detector 3, and the voltage that develops across the microbolometer as a result is measured. Again, Ohms Law defines the relationship between the applied current and the measured voltage.

$$V_{out} = I_{applied} * R_{bolometer} \quad (2)$$

A third method for measuring the microbolometer resistance is shown in FIG. 4. This circuit includes a resistive load 6. A voltage is applied across the series combination of the microbolometer 3 and the load 6. The microbolometer resistance can be determined by measuring the voltage across the microbolometer. The following expression describes the microbolometer resistance as a function of applied voltage bias, load resistance, and the measured voltage across the microbolometer.

$$R_{bolometer} = R_{load}/[V_{applied}/V_{out} - 1] \quad (3)$$

where $R_{load}$ is the value of load resistor 6.

These circuit implementations may be used to measure infrared radiation incident on the microbolometer by sensing the change in microbolometer temperature due to the optical (infrared) energy absorbed by the detector. The temperature rise in the microbolometer detector due to self-heating generally is significantly larger than the temperature rise resulting from the incident infrared radiation. The relatively small contribution of incident radiation to the change in microbolometer resistance is difficult to detect. For this reason, it is desirable to incorporate more complex circuits using in circuit reference schemes in order to minimize the contribution of self-heating to the output signal. In the case of the resistive load circuit approach (FIG. 4), the load resistor 6 may be designed to have a low temperature coefficient of resistance, or it may be thermally shorted to the substrate, or shielded from incident infrared radiation.

Commonly, the outputs as described by the aforementioned equations are converted to a digital representation or number by way an analog-to-digital output converter (A/D converter). The A/D output converter generally has a limited range from zero to some maximum value.

Circuits and methods similar to those just described have been commonly employed in conjunction with a thermoelectric cooler so as to maintain the substrate at a constant temperature and thereby avoid large swings in the output measurements, since only the detected temperature change induced by infrared radiation is detected.

Figure 5:
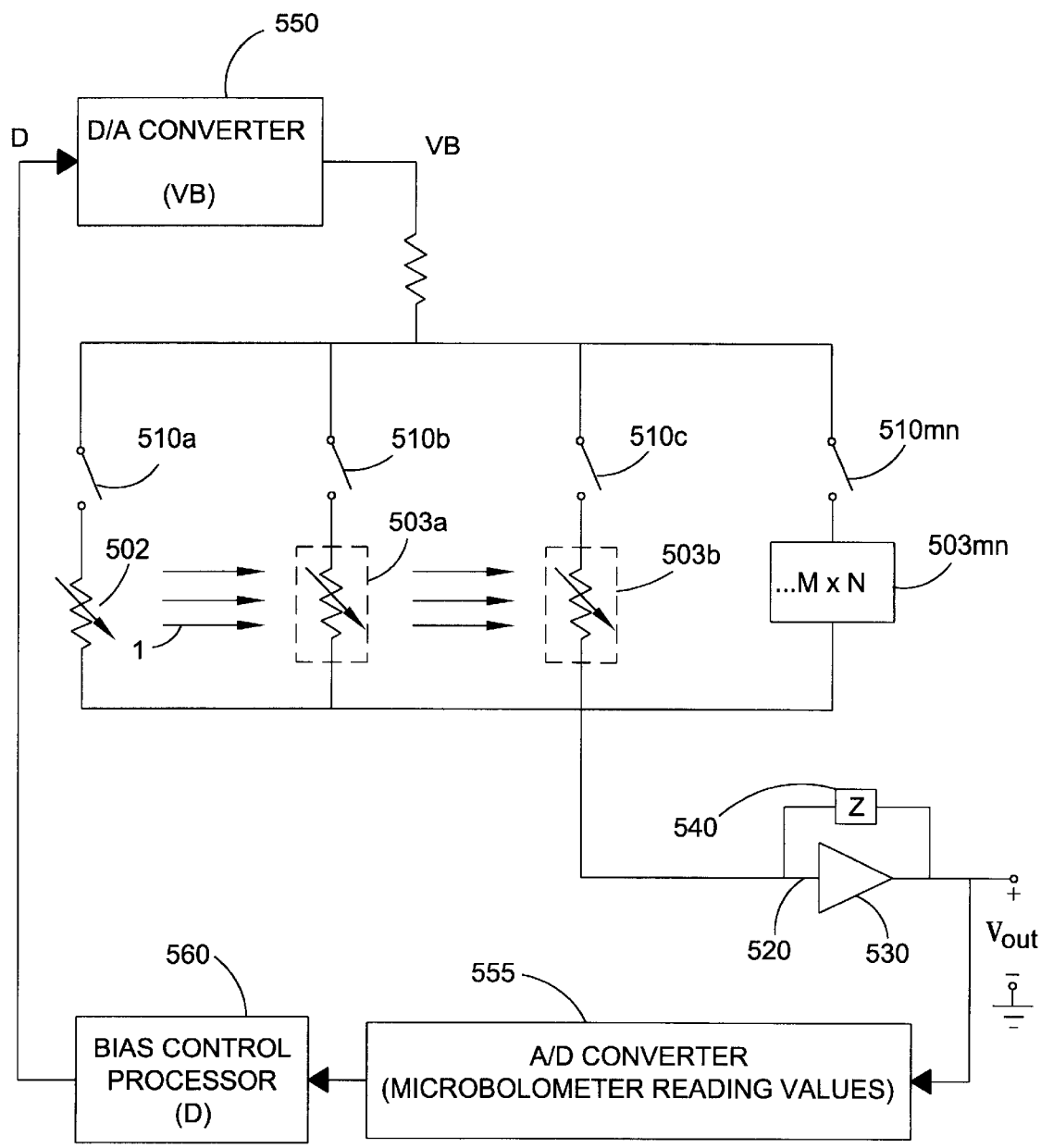
FIG. 5 is a schematic diagram of bias controlled microbolometer system in accordance with the present invention.

FIG. 5 is a simplified schematic diagram of microbolometer imaging apparatus with controlled bias in accordance with the present invention. There shown are one thermally-shorted microbolometer 502 and two thermally-isolated microbolometers 503a and 503b. A variable bias voltage (VB) or electric potential is applied to one terminating end of each of the microbolometers 502, 503a, and 503b through multiplex switches 510a–510a, respectively. The other terminating end of each of the microbolometers is connected to an input terminating means 520 of amplifier 530 having a appropriate gain as determined by feedback impedance 540. In turn, the output of amplifier 530 is connected to A/D converter 555.

In FIG. 5, the variable applied voltage bias VB is provided by way of a digital-to-analog converter (DIA converter) 550, which receives a digital signal D from a bias control processor 560. Bias control processor 560 is intended to be responsive to selected output information from A/D converter 555 in a manner which will be subsequently described with reference to FIGS. 6 and 7. It should be noted that associated with a digital-to-analog converter 550 is a "bias range", i.e. the output voltage bias VB may vary between some selected minimum and a maximum.

Bias control processor 560 is intended to serve as a feedback information processor for controlling the applied voltage bias, simply referred to as "bias," as a function of selected historical information as derived form the behavior of the both the thermally isolated-microbolometers 503a and 503b, and the non-thermally-isolated-microbolometer 502, i.e., the thermally-shorted microbolometer 502.

It should be noted that microbolometers 503a and 503b are representative of a typical microbolometer comprising an M×N array of microbolometers identified in FIG. 5 as 503 mn. Each of the M×N array microbolometers are multiplexed to the detector circuit through switches identified by switch 510 mn as is well understood in the art. However, it should be understood that in accordance with the present invention, that the detector circuit employs a common electric signal bias source VB for deriving the desired information, namely the resistance of each of the bolometers of the M×N array.

Figure 6:
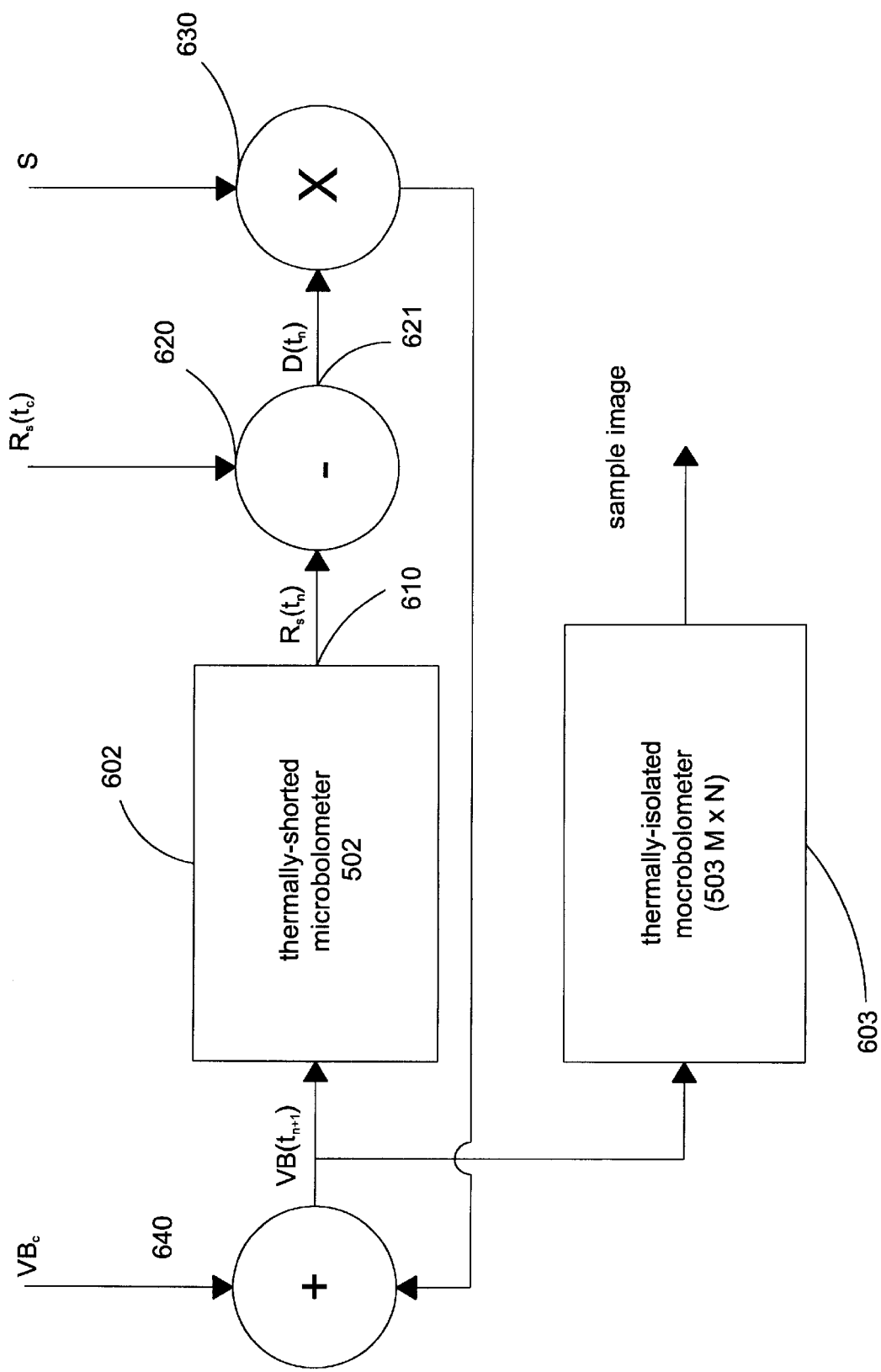
FIG. 6 is a block diagram depicting the bias control feedback scheme of the present invention.

FIG. 6 is a schematic block diagram illustrating an exemplary bias control processor 560 feedback arrangement in accordance with the principles of the present invention for controlling the applied voltage bias. There shown is block 602, which represents thermally-shorted microbolometer 502 and corresponding detector circuitry as illustrated in FIG. 5, for reading the resistance value $R_s(t_n)$. The output 610, thereof, represents the resistance $R_s(t_n)$ of the thermally-shorted-microbolometer 502 at sample time $t_n$. Difference block 620 is intended to provide an output 621 representative of the difference between $R_s(t_c)$ and the current value of the resistance, $R_s(t_n)$, of the thermally shorted-microbolometer 502 at the "calibration time $t_c$". $VB_c$ represents an initial value of the voltage bias at the calibration time $t_c$. In turn, the output of difference block 620 is multiplied by a scale factor in block 630. The output of block 630 is provided as one input to summing block 640 which is intended to be summed with the initial bias value, $VB_c$.

Before proceeding, it should be recognized that each microbolometer of the focal plane array exhibits its own temperature-resistance characteristic. As is well understood in the art, a common calibration routine exposes the focal plane array to a black-body at a known temperature, and in which the microbolometer array is at a known ambient operating temperature, and in which an electric signal bias source of a selected magnitude is applied to each of the microbolometers. The magnitude of electric signal bias source employed in the detector circuit is, of course, a matter of design choice. However, in accordance with preferred embodiment of the invention, the initial value $VB_c$ of the applied voltage bias is intended to be such that the average of the A/D converter 555 output reading values of all of the thermally-isolated-microbolometers at substantially the calibration sample time is centered in the range of the A/D converter 555.

Further, at this calibration time $t_c$, the thermally-shorted-microbolometer 502 will exhibit its own characteristics, and have a particular initial resistance value at the calibration sample time $t_c$. In accordance with present invention, the applied voltage bias for all of the microbolometer detectors is intended to be adjusted or varied to a new value for the next sample time of the image as a function of the difference between the current value of the resistance of the thermally-shorted-microbolometer 502 associated with last sample time of an image and the resistance of the thermally-shorted-microbolometer 502 at the calibration time $t_c$.

Figure 7:
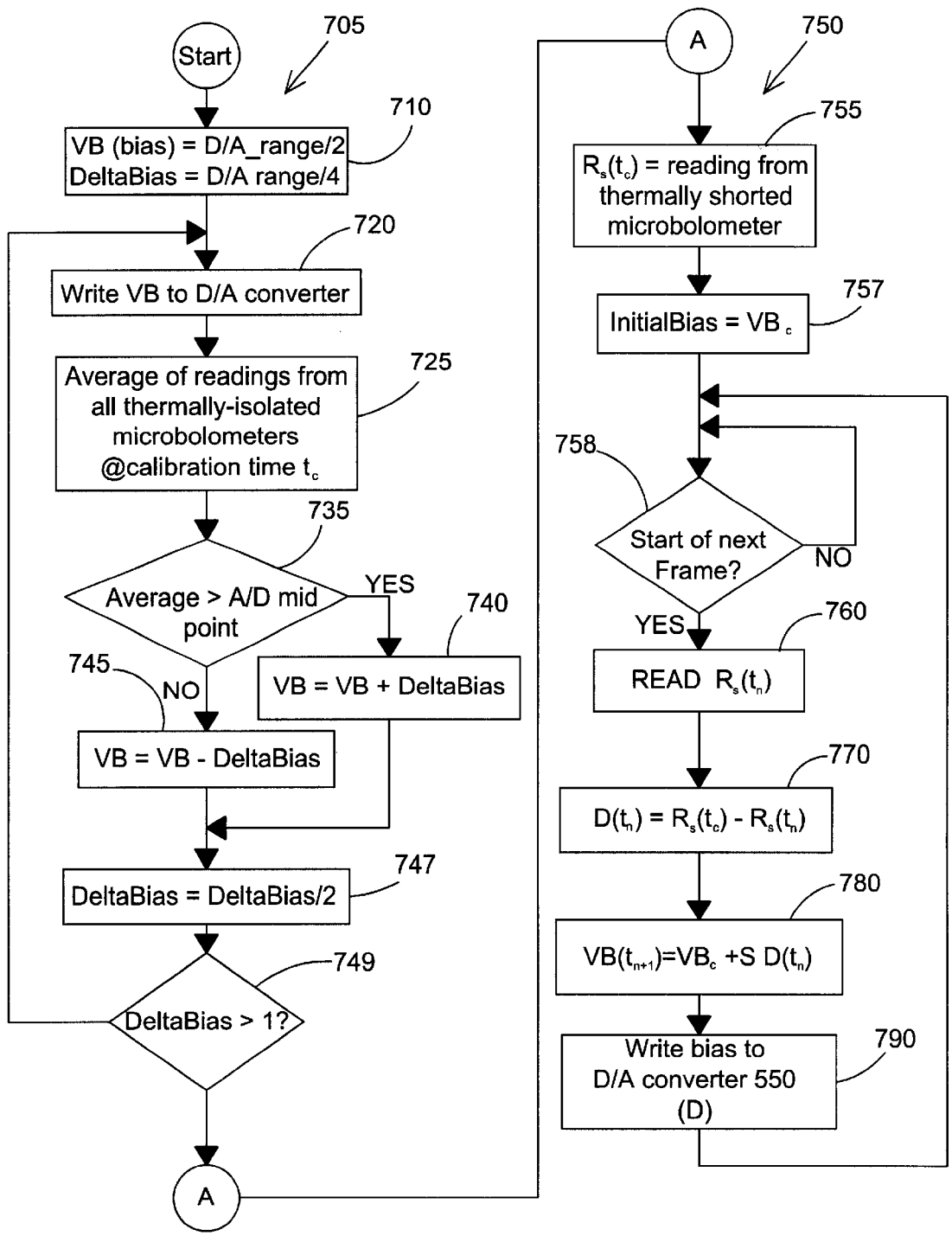
FIG. 7 is a flow diagram illustrating the bias control feedback system in accordance with the present invention.

The aforementioned calibration procedure described above is particularly described in the flow diagram depicted in FIG. 7 which is intended to be implemented by way of hardware, firmware, software, or the like. The method, exemplified in FIG. 7 includes a binary search method, 705, for determining an "initial calibrated bias value," and a bias control loop 750. Briefly, the bias is set, block 710, to an initial value which corresponds to the midpoint of the range of the DIA converter 550 which provides the bias to all of the microbolometers 502, 503a, and 503b. All of the M×N thermally-isolated microbolometers 503 mn are sampled at an instant of time, and the digital output readings from A/D converter 555 are averaged, block 725, and compared, block 735, with the midpoint of the range of the A/D converter 555. In turn, the digital value of the bias is incremented or decremented, blocks 740 and 745, by a "delta bias value"—initially set to one fourth of the range of the D/A converter 550, and value of delta bias is reduced by half, block 747. This process continues until a limit is reached where no further improvement may be made—delta bias is less than one, block 749. At the end of this binary search, an "initial calibrated bias value," $VB_c$ has been determined at which the average of all of thermally-isolated microbolometers is at the midpoint of the output A/D converter 555.

Immediately following the determination of the "initial calibrated bias value," $VB_c$, a bias control loop, 750, is implemented. First, a microbolometer resistance reading value, identified by $R_s(t_c)$, is taken from the thermally-shorted microbolometer 502 immediately after the initial calibration bias value has been determined, block 755, 757. $R_s(t_c)$ is essentially representative of the substrate temperature at the calibration time and is herein referred to as the "calibration substrate temperature value." $R_s(t_c)$ occurs with the bias set at the initial calibrated bias value, $VB_c$. After each image sample time, i.e., microbolometer 503 detector values determined and stored, the current reading sample of the thermally shorted-micro-bolometer 502 $R_s(t_n)$, block 760, is subtracted from the calibration substrate temperature value $R_s(t_c)$, block 770. The difference $D(t_n)$ is multiplied by a constant or scale factor, S, and added to the initial calibrated bias value $VB_c$, block 780. In turn, the bias is changed to the new value, $VB(t_{n+1})$, block 790, and another image sample or frame is taken, block 758—the process repeating.

In the preferred embodiment of the invention, the scale factor S is empirically determined during calibration. That is, the microbolometer array is subjected to various ambient temperatures in order to determine sensitivity of the thermally-isolated microbolometers with regard to applied bias and temperature.

In the foregoing description of the present invention, and particularly the detector arrangement of FIG. 3, and applied electric potential or voltage was utilized as the "bias" for operating the microbolometers. However, it should be recognized that the bias control scheme of the present invention, and particularly described by way of FIGS. 5, 6 and 7, may be applicable to any electric signal source, including electric potential sources as utilized in FIGS. 3 and 4, and current sources as depicted in FIG. 2. More specifically, a current source may be calibrated initially to a calibration bias value which may be varied in accordance with the difference between the calibration substrate temperature value $R_s(t_c)$ and the subsequent samples of the same thermally shorted microbolometer detector.

As should be apparent to those skilled in the art, the flow diagram illustrated in FIG. 7 may be implemented by a wide range of devices for implementing a set of instructions including microprocessors, computers, specific hardware, firmware, and the like. Although, A/D and D/A converters have been illustrated other forms of electronic implementation for control of an electrical bias and reading of the microbolometer values and associated information are, of course, possible, all of which are intended to be within the true spirit and scope of the present invention.

While the present invention has been particularly shown and described with reference to the accompanying figures, it will be understood, however, that other modifications thereto are of course possible, all of which are intended to be within the true spirit and scope of the present invention. Various changes in form and detail may be made therein without departing from the true spirit and scope of the invention as defined by the appended claims.

We claim:

1. A method for controlling bias for an microbolometer focal plane array associated with a substrate, and which said microbolometer focal plane array includes a plurality of substrate-isolated microbolometer detectors and one thermally-shorted microbolometer detector thermally shorted to said substrate, and wherein associated with said microbolometer focal plane array is a circuit means, including an electric signal bias source, for determining, for each of said microbolometer detectors, a reading value representative of the corresponding temperature associated therewith, the method comprising the steps of:

setting the magnitude said electric signal bias source to a bias source calibration magnitude such that an average value representative of the average of each reading value associated with all of said substrate-isolated microbolometer detectors at a calibration instant of time is substantially at a selected value within a selected reading value range at a calibration instant of time;

determining a bias temperature reference reading value representative of the temperature of said thermally-shorted microbolometer detector at substantially said calibration instant of time;

determining a bias temperature reference reading value representative of the temperature of said thermally-shorted microbolometer detector at selected instants of time subsequent to said calibration instant of time;

adjusting said bias electric signal source to an operating magnitude value, where said operating magnitude value is substantially equal to the sum of:
  (i) said bias source calibration magnitude, and
  (ii) a selected scale factor multiplied by the difference between
    a. said bias temperature reference reading value at said calibration instant of time, and
    b. said bias temperature reference reading value corresponding to a last occurring one of said selected instants of time.

2. The method of claim 1 wherein said electric signal bias source is a voltage source.

3. The method of claim 1 wherein said electric signal bias source is a current source.

4. The method of claim 1 wherein said selected scale factor is empirically determined.

5. The method of claim 1 wherein said average value representative of the average of each reading value associated with all of said substrate-isolated microbolometer detectors at a calibration instant of time is substantially at the mid-point of said selected range.

6. A microbolometer imaging apparatus comprising:
  a microbolometer focal plane array associated with a substrate, and which said microbolometer focal plane array includes,
    a plurality of substrate-isolated microbolometer detectors each having a resistance value related to its sensed temperature thereof, and
    one thermally-shorted microbolometer detector thermally shorted to said substrate, and having a resistance value related to its sensed temperature thereof;
  circuit means associated with said microbolometer focal plane array for determining, for of each of said microbolometer detectors, a reading value representative of the corresponding temperature associated therewith, said circuit means including means for providing an electric signal bias source selectively coupled to each of said microbolometers for separately passing a current through each of said microbolometer detectors;

bias source control means for controlling the operation magnitude value of said electric signal bias source, said bias control means including,
  means for initializing said electric signal bias source to a calibration magnitude at a calibration instant of time,
  means for determining a bias temperature reference reading value representative of the temperature of said thermally-shorted microbolometer detector at substantially said calibration instant of time,
  means for determining a bias temperature reference reading value representative of the temperature of said thermally-shorted microbolometer detector at selected instants of time subsequent to said calibration instant of time, and
  means for setting said operating magnitude value of said electric signal bias source substantially equal to the sum of:
    (i) said bias source calibration magnitude, and
    (ii) a selected scale factor (S) multiplied by the difference between
      a. said bias temperature reference reading value at said calibration instant of time, and
      b. said bias temperature reference reading value corresponding to a last occurring one of said selected instants of time.

7. The apparatus of claim 6 wherein said electric signal bias source is a voltage source.

8. The apparatus of claim 6 wherein said electric signal bias source is a current source.

9. The apparatus of claim 6 wherein said bias source control means includes a digital-to-analog converter for receiving digital information representative of desired magnitude of said electric signal bias source and outputting an analog value representative thereof.

10. The method of claim 6 wherein said selected scale factor (S) is empirically determined.

11. The method of claim 6 wherein said calibration magnitude is selected such that that an average value, representative of the average of each reading value associated with all of said substrate-isolated microbolometer detectors, at said calibration instant of time, is substantially at a midpoint of a selected reading value range.

12. The method of claim 6 wherein said calibration magnitude is selected such that that an average value, representative of the average of each reading value associated with all of said substrate-isolated microbolometer detectors, at said calibration instant of time, is substantially at a selected operating point within a selected reading value range, thereof.

13. The method of claim 12 wherein said average value, representative of the average of each reading value associated with all of said substrate-isolated microbolometer detectors, at said calibration instant of time, is substantially at the mid-point within said selected reading value range.

* * * * *